United States Patent
Nakano et al.

(10) Patent No.: US 10,597,771 B2
(45) Date of Patent: Mar. 24, 2020

(54) RARE EARTH THIN-FILM MAGNET AND METHOD FOR PRODUCING SAME

(71) Applicant: JX Nippon Mining & Metals Corporation, Tokyo (JP)

(72) Inventors: Masaki Nakano, Nagasaki (JP);
Hirotoshi Fukunaga, Nagasaki (JP);
Takeshi Yanai, Nagasaki (JP);
Hironobu Sawatari, Ibaraki (JP)

(73) Assignee: JX NIPPON MINING & METALS CORPORATION, Tokyo (JP)

( * ) Notice: Subject to any disclaimer, the term of this patent is extended or adjusted under 35 U.S.C. 154(b) by 267 days.

(21) Appl. No.: 15/522,037

(22) PCT Filed: Oct. 19, 2015

(86) PCT No.: PCT/JP2015/079420
§ 371 (c)(1),
(2) Date: Apr. 26, 2017

(87) PCT Pub. No.: WO2016/067949
PCT Pub. Date: May 6, 2016

(65) Prior Publication Data
US 2017/0356081 A1     Dec. 14, 2017

(30) Foreign Application Priority Data

Oct. 27, 2014  (JP) ................. 2014-218378

(51) Int. Cl.
*H01F 41/20*     (2006.01)
*H01F 1/057*     (2006.01)
(Continued)

(52) U.S. Cl.
CPC .............. *C23C 14/28* (2013.01); *C23C 14/14* (2013.01); *C23C 14/58* (2013.01);
(Continued)

(58) Field of Classification Search
None
See application file for complete search history.

(56) References Cited

U.S. PATENT DOCUMENTS 7,790,300 B2    9/2010  Suzuki et al.
2011/0179640 A1*  7/2011  Arnold ............... H01L 24/95
                                                        29/825

(Continued)

FOREIGN PATENT DOCUMENTS

JP     2003-303708 A    10/2003
JP     2007-088101 A     4/2007
(Continued)

OTHER PUBLICATIONS

Chen et al. (J. Appl. Phys., 98, 033907, 2005). (Year: 2005).*
(Continued)

*Primary Examiner* — Kevin M Bernatz
(74) *Attorney, Agent, or Firm* — Howson & Howson LLP

(57) ABSTRACT

A rare earth thin-film magnet of a Nd—Fe—B film deposited on a Si substrate, wherein, when the film thickness of the rare earth thin film is 70 μm or less, the Nd content satisfies the conditional expression of 0.15≤Nd/(Nd+Fe) ≤0.25 in terms of an atomic ratio; when the film thickness of the rare earth thin film is 70 μm to 115 μm (but excluding 70 μm), the Nd content satisfies the conditional expression of 0.18≤Nd/(Nd+Fe)≤0.25 in terms of an atomic ratio; and when the film thickness of the rare earth thin film is 115 μm to 160 μm (but excluding 115 μm), the Nd content satisfies the conditional expression of 0.20≤Nd/(Nd+Fe)≤0.25 in terms of an atomic ratio. An object of the present invention is to provide a rare earth thin-film magnet having a maximum film thickness of 160 μm and which is free from film (Continued)

separation and substrate fracture, and a method of producing such a rare earth thin-film magnet by which the thin film can be stably deposited.

11 Claims, 5 Drawing Sheets

(51) Int. Cl.
```
C23C 14/28      (2006.01)
C23C 14/14      (2006.01)
C23C 14/58      (2006.01)
H01F 10/12      (2006.01)
H01F 10/14      (2006.01)
H01F 41/32      (2006.01)
```
(52) U.S. Cl.
CPC ......... *C23C 14/5806* (2013.01); *H01F 1/057* (2013.01); *H01F 10/126* (2013.01); *H01F 10/14* (2013.01); *H01F 41/205* (2013.01); *H01F 41/32* (2013.01)

(56) References Cited

U.S. PATENT DOCUMENTS

| | | | |
|---|---|---|---|
| 2013/0248754 A1* | 9/2013 | Sakuma | H01F 41/0273 252/62.55 |
| 2015/0017053 A1 | 1/2015 | Shindo | |
| 2015/0047469 A1 | 2/2015 | Hino et al. | |
| 2015/0262752 A1 | 9/2015 | Sawatari | |
| 2016/0343482 A1 | 11/2016 | Nakano et al. | |
| 2018/0053523 A1* | 2/2018 | Lisec | G01R 33/06 |
| 2019/0062880 A1* | 2/2019 | Nakano | C23C 14/06 |

FOREIGN PATENT DOCUMENTS

| | | |
|---|---|---|
| JP | 2009-091613 A | 4/2009 |
| JP | 2012-207274 A | 10/2012 |

OTHER PUBLICATIONS

Chukuba et al. (Intermag 2015) (Year: 2015).*
Constantinescu et al. (Appl. Surf. Sci., 253, 2007, 8192-8196). (Year: 2007).*
Jiang et al. (PowermEMS 2009, Washington DC, Dec. 1-4, 2009) (Year: 2009).*
Nakano et al. (J. Appl. Phys., 107, 09A744, 2010) (Year: 2010).*
Nakano et al. (IEEE Trans. Mag., v51(11), Nov. 2015) (Year: 2015).*
Pawlowski et al. (J. Mag., Mag. Mat., 265, 2003, 337-344) (Year: 2003).*
Sood et al. (Characterisation of NdFeB Thin Films Prepared on (100)Si Substrates with SiO2 Barrier Layers (1998)) (Year: 1998).*
Speliotis et al. (IEEE Trans. Mag., 41(10), Oct. 2005) (Year: 2005).*
Sun et al. (J. Mag. Mag. Mat., 164, 1996, 18-26) (Year: 1996).*
Tsai et al. (IEEE Trans. Mag., v37(4), Jul. 2001) (Year: 2001).*
Zheng et al. (Surf. & Coat. Tech., 194, 2005, 372-377). (Year: 2005).*
H. Fukunaga et al., "Effect of Laser Beam Parameters on Magnetic Properties of Nd-Fe-B Thick-Film Magnets Fabricated by Pulsed Laser Deposition", Journal of Applied Physics, vol. 109, Issue 7, pp. 07A758-1-07A7583, Apr. 2011.
N.M. Dempsey et al., "High Performance Hard Magnetic NdFeB Thick Films for Integration into Micro-Electro-Mechanical-Systems", Applied Physics Letters, vol. 90, pp. 092509-1-092509-3, 2007 (month unknown).
H. Fukunaga et al., "Magnetic Properties of Nd-Fe-B/a-Fe Multi-Layered Thick-Film Magnets", Journal of Physics: Conference Series, vol. 266, pp. 012027-1-012027-5, 2011 (month unknown).
G. Reiger et al., "Nd-Fe-B Permanent Magnets (Thick Films) Produced by a Vacuum-Plasma-Spraying Process", Journal of Applied Physics, vol. 87, pp. 5329-5331, 2000 (month unknown) (Abstract Only).
M. Nakano et al., "Review of Fabrication and Characterization of Nd-Fe-B Thick Films for Magnetic Micromachines", IEEE Transactions on Magnets, vol. 43, Issue 6, pp. 2672-2676, Jun. 2007 (Abstract Only).
M. Ishizone et al., "Magnetic Properties and Crystallite Orientation in Nd2Fe14B-a-Fe Nanocomposite Thin Films", The Magnetics Society of Japan Journal, vol. 24, No. 4-2, pp. 423-426, Jan. 2000.
S Sato, "Nano Kessho Kozo o Motsu Nanshitsu Oyobi Koshitsu Jisei Zairyo ni Okeru Hojiryoku Kiko no Kaiseki", University of Tsukuba Daigakuin Hakushi Katei Suri Busshitsu Kagaku Kenkyuka Hakushi Ronbun, University of Tsukuba Daigakuin, pp. 91 to 98, Feb. 2012 (English Summary provided).
N. Adachi et al., "Synthesys of the Rare Earth Magnetic Film for Microactuators", Ceramics Research Laboratory, Nagoya Institute of Technology, vol. 6, pp. 46-50, 2006 (month unknown) (English Abstract provided).
Nakano et al., "Film Formation Isotropic Nd-Fe-B Thick Film Magnet of Si Substrate", The Institute of Electrical Engineers of Japan, Article No. MAG13075, Aug. 2013 (English Abstract Only).

\* cited by examiner

[Fig. 1]
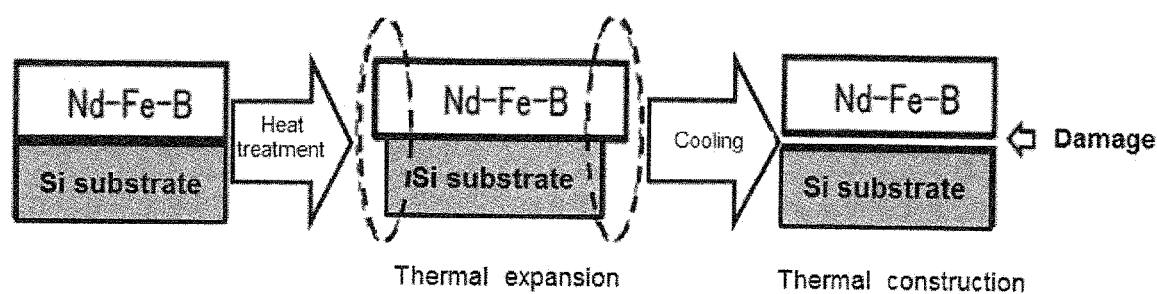
[Fig. 2]
| | α: Thermal expansion coefficient ($\times 10^{-6} K^{-1}$) |
|---|---|
| Nd-Fe-B | 14.7 |
| Fe | 11.8 |
| Nd | 9.6 |
| Si | 2.6 |

[Fig. 3]
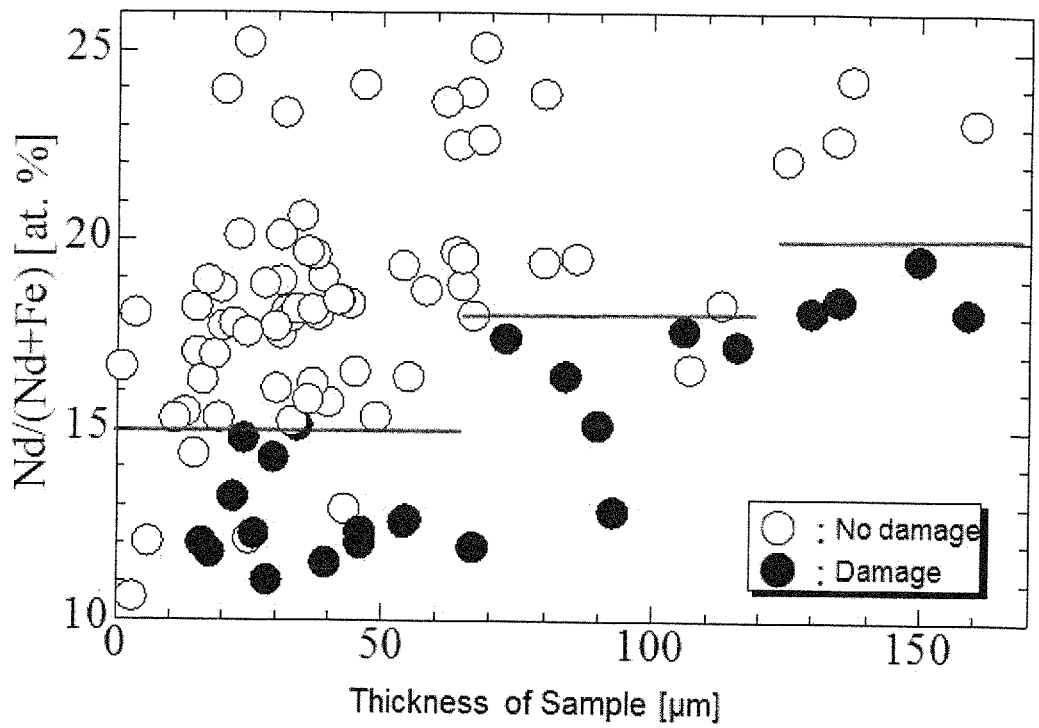
[Fig. 4]
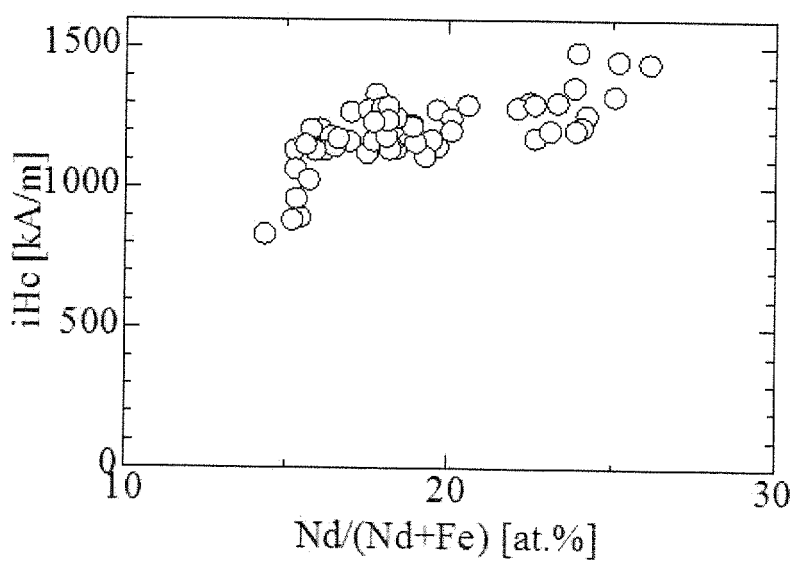

[Fig. 5]
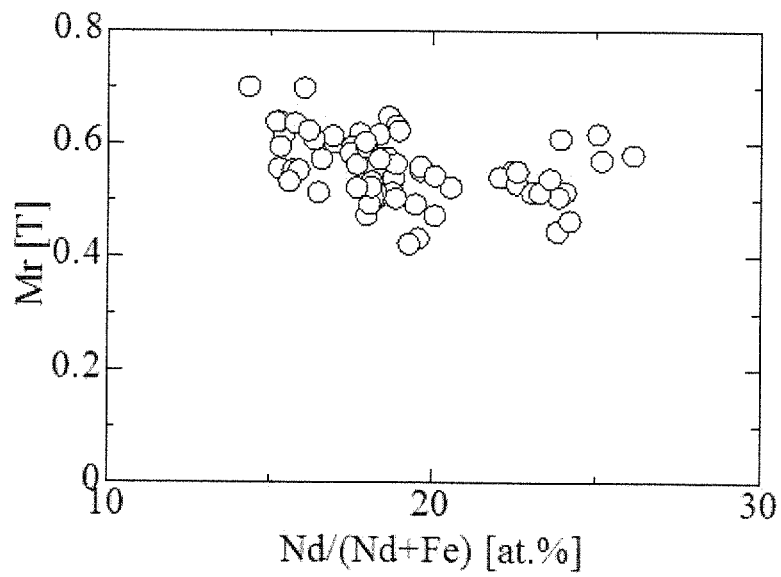
[Fig. 6]
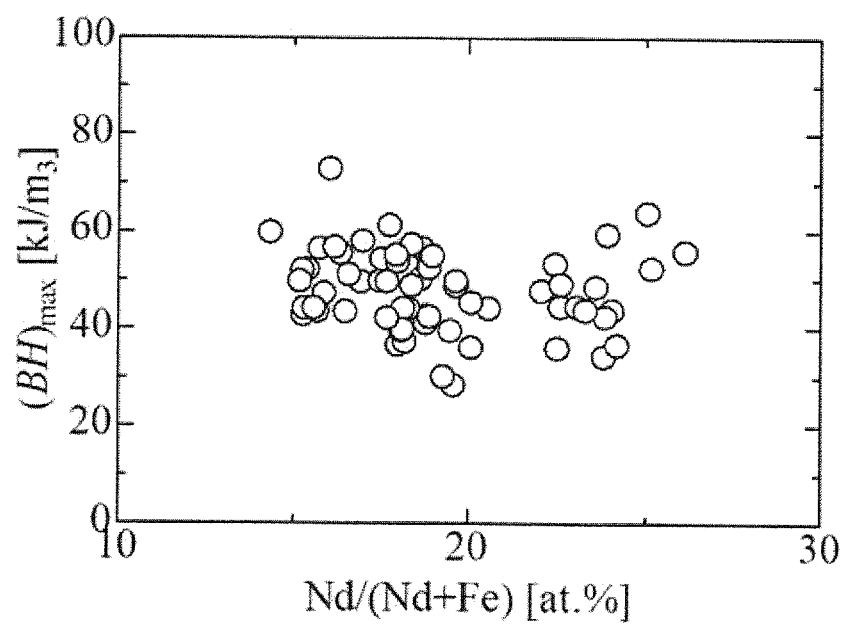

[Fig. 7]
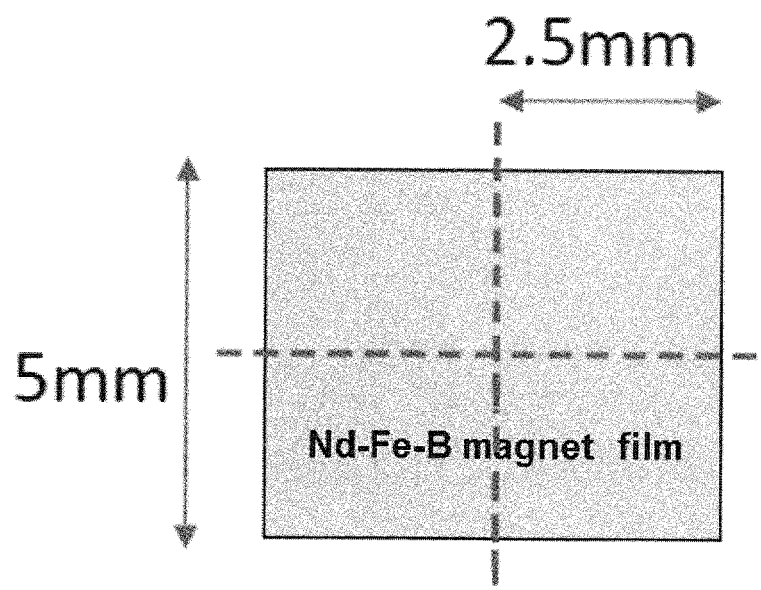
[Fig. 8]
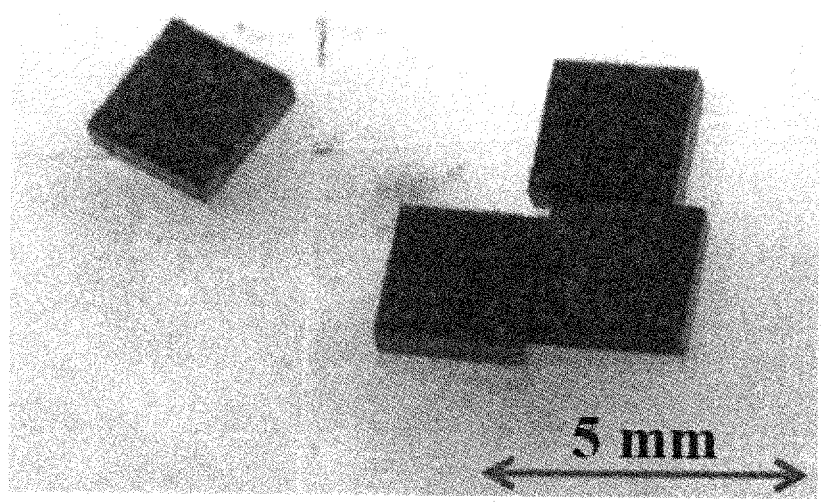

[Fig. 9]
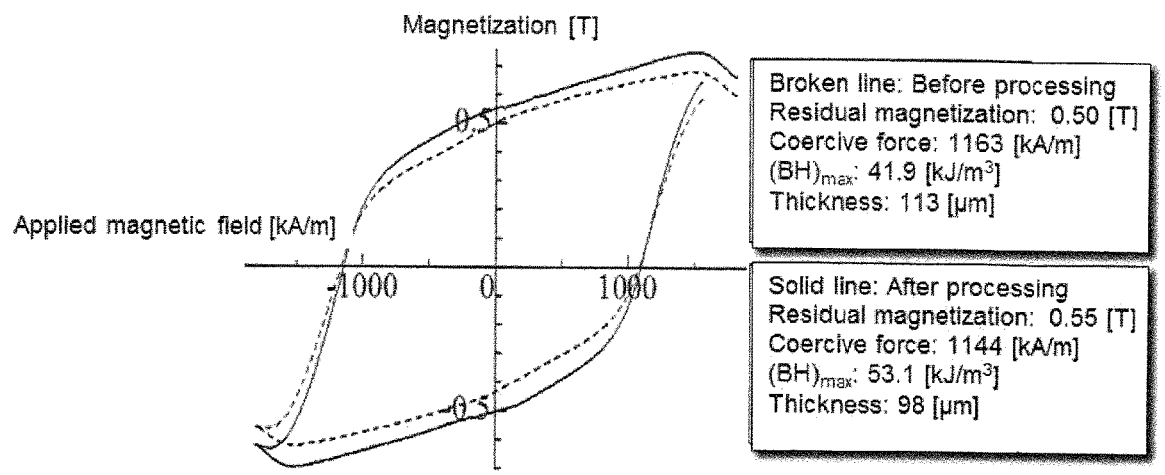
[Fig. 10]
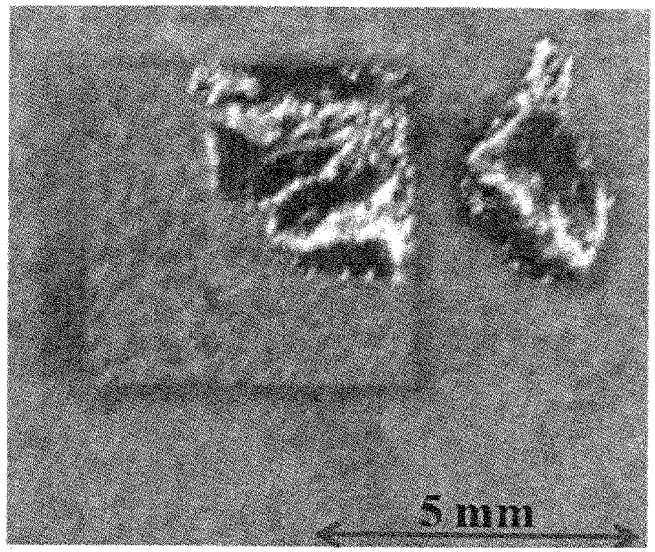

RARE EARTH THIN-FILM MAGNET AND METHOD FOR PRODUCING SAME

BACKGROUND

The present invention relates to a rare earth thin-film magnet of a Nd—Fe—B film formed on a silicon substrate and a method of producing a rare earth thin-film magnet of a Nd—Fe—B film formed via pulsed laser deposition (PLD).

In recent years, pursuant to the weight-saving and downsizing of electronic devices, the miniaturization and sophistication of rare earth magnets having superior magnetic properties are being advanced. Since a neodymium-iron-boron (Nd—Fe—B)-based magnet exhibits the highest maximum energy product among existing magnets, the practical application thereof to MEMS (Micro Electra Mechanical Systems), energy sectors such as energy harvest, and medical device sectors is expected.

This kind of rare earth magnet thin film is known to be produced via the sputtering method (Patent Document 1, Non-Patent Document 1) or via pulsed laser deposition method (Patent Document 2, Non-Patent Document 2) or other PVD (Physical Vapor Deposition) methods (Non-Patent Document 3). In these documents, a rare earth magnet thin film is formed on a metal substrate made from Ta, Mo or the like.

Meanwhile, in order to effectively leverage the lithographic technique based on silicon (Si) semiconductors, the stable formation of a Nd—Fe—B film on a versatile Si substrate is strongly desired upon preparing micro actuators of micro magnetic devices for MEMS.

Non-Patent Document 4 describes that, when a magnetic film having a composition that is equivalent to $Nd_2Fe_{14}B$, which is a stoichiometric composition, is directly deposited on a Si substrate, stress is generated during the heat treatment of the deposited film due to the difference in thermal expansion rate between the Si substrate and the $Nd_2Fe_{14}B$ film, and the magnet film may become separated. Non-Patent Document 4 additionally describes that it is possible to form a Nd—Fe—B film that is free from separation, even with a thickness of 2 μm, by forming a $MoSi_2$ strain buffer film having a thickness of 50 nm on a Si substrate as a means for alleviating the stress in the heat treatment. Nevertheless, the film thickness of 2 μm is insufficient for extracting a sufficient magnetic field from the film surface to the outside due to the demagnetizing field in the film, and a film having a thickness of at least 10 μm or more is demanded. Meanwhile, when there is a difference in thermal expansion rate between the substrate and the film, the stress applied on the film will increase as the film thickness is increased, and film separation tends to occur more easily. Thus, a strain buffer film material that is free from the generation of separation even when depositing a thick Nd—Fe—B film on a Si substrate has been awaited for many years.

The present inventors previously developed a technique which enables the stable deposition of a Nd—Fe—B film having a thickness of 10 μm to 1.2 mm on a Ta substrate via laser deposition using a pulsed YAG laser. This deposition method is characterized in that there is superior compositional transcription between the target and the film, and the deposition rate is faster than the sputtering method by one order of magnitude or more. Furthermore, Non-Patent Document 5 describes that it is possible to deposit a Nd—Fe—B film, which is free from separation up to a maximum film thickness of 20 μm, on a Si substrate via pulsed laser deposition by interposing a Ta film having an intermediate value of the thermal expansion coefficient of Si and the thermal expansion coefficient of $Nd_2Fe_{14}B$. Nevertheless, when a film having a thickness exceeding 20 μm is formed, there are problems in that separation occurs between the Nd—Fe—B film and the Ta film and a fracture is generated inside the Si substrate.

CITATION LIST

Patent Documents

Patent Document 1: JP 2012-207274 A
Patent Document 2: JP 2009-091613 A

Non-Patent Documents

Non-Patent Document 1: N. M. Dempsey, A. Walther, F. May, D. Givord, K. Khlopkov, O. Gutfeisch: Appl. Phys. Lett. Vol. 90 (2007) 092509-1-092509-3
Non-Patent Document 2: H. Fukunaga, T. Kamikawatoko, M. Nakano, T. Yanai, F. Yamashita: J. Appl. Phys. Vol. 109 (2011) 07A758-1-07A758-3
Non-Patent Document 3: G. Rieger, J. Wecker, W. Rodewalt, W. Scatter, Fe.-W. Bach, T. Duda and W. Unterberg: J. Appl. Phys. Vol. 87 (2000) 5329-5331
Non-Patent Document 4: Adachi, Isa, Ohta, Okuda: Ceramics Research Laboratory, Annual Report Vol. 6 (2006) 46-50
Non-Patent Document 5: Oryoji, Nakano, Yanai, Fukunaga, Fujii: The Institute of Electrical Engineers of Japan, Magnetics Workshop Papers, MAG-13-075 (2013)

SUMMARY

An object of the present invention is to provide a rare earth thin-film magnet of a Nd—Fe—B film deposited on a Si substrate, and in particular to provide a rare earth thin-film magnet having a maximum film thickness of 160 μm and which is free from film separation and substrate fracture, and a method of producing such a rare earth thin-film magnet by which the thin film can be stably deposited.

In order to achieve the foregoing object, as a result of intense study, the present inventors discovered that, by optimizing the composition of the Nd—Fe—B film to be deposited via pulsed laser deposition, it is possible to deposit a Nd—Fe—B film, which is free from separation and other problems, without having to provide a strain buffer layer.

Based on the foregoing discovery, the present invention provides the following means.

1) A rare earth thin-film magnet of a Nd—Fe—B film deposited on a Si substrate, wherein, when a film thickness of the rare earth thin film is 70 μm or less, a Nd content satisfies a conditional expression of $0.15 \leq Nd/(Nd+Fe) \leq 0.25$ in terms of an atomic ratio; when a film thickness of the rare earth thin film is 70 μm to 115 μm (but excluding 70 μm), a Nd content satisfies a conditional expression of $0.18 \leq Nd/(Nd+Fe) \leq 0.25$ in terms of an atomic ratio; and when a film thickness of the rare earth thin film is 115 μm to 160 μm (but excluding 115 μm), a Nd content satisfies a conditional expression of $0.20 \leq Nd/(Nd+Fe) \leq 0.25$ in terms of an atomic ratio.

2) The rare earth thin-film magnet according to 1) above, wherein the rare earth thin-film magnet has a coercive force of 1000 kA/m or more.

3) The rare earth thin-film magnet according to 1) or 2) above, wherein the rare earth thin-film magnet has a residual magnetization of 0.4 T or more.

4) The rare earth thin-film magnet according to any one of 1) to 3) above, wherein the rare earth thin-film magnet has a maximum energy product of 40 kJ/m$^3$ or more.

5) A method of producing the rare earth thin-film magnet according to any one of 1) to 4) above, comprising: a step of depositing the rare earth thin film via pulsed laser deposition; a step of crystallizing the deposited rare earth thin film by performing heat treatment thereto; and a step of magnetizing the crystallized rare earth thin film to prepare the rare earth thin-film magnet.

6) The method of producing the rare earth thin-film magnet according to 5) above, wherein, in the step of depositing the rare earth thin film, pulsed laser power density is set to 0.1 to 100 J/cm$^2$.

7) The method of producing the rare earth thin-film magnet according to any one of 4) to 6) above, wherein, in the step of crystallizing the rare earth thin film, pulsed heat treatment is performed under the following conditions; namely, rated output of 2 to 10 kW and maximum output holding time of 1 to 3 seconds.

The present invention yields a superior effect of being able to deposit a rare earth thin-film magnet of a Nd—Fe—B film, which is free from film separation and substrate fracture and has a maximum film thickness of 160 μm, on a Si substrate via pulsed laser deposition. Furthermore, the obtained rare earth thin-film magnet yields a superior effect of exhibiting favorable magnetic properties. In addition, the present invention yields a superior effect of being able to improve the productivity from the perspective of production costs because a rare earth thin-film magnet can be stably deposited without having to form a strain buffer layer, which is made from a material that is different from the film material.

BRIEF DESCRIPTION OF DRAWINGS

FIG. 1 This is a diagram showing the Nd—Fe—B film separation mechanism.

FIG. 2 This is a diagram showing the thermal expansion coefficient of the respective materials.

FIG. 3 This is a diagram showing the relation of the Nd content and the film thickness that affect the separability of the Nd—Fe—B film.

FIG. 4 This is a diagram showing the relation of the coercive force and the Nd content of the Nd—Fe—B film.

FIG. 5 This is a diagram showing the relation of the residual magnetization and the Nd content of the Nd—Fe—B film.

FIG. 6 This is a diagram showing the relation of the maximum energy product (BH)$_{max}$ and the Nd content of the Nd—Fe—B film.

FIG. 7 This is a schematic diagram showing the dicing method of the sample of Example 1 of the present invention.

FIG. 8 This is a photograph showing the sample of Example 1 of the present invention after the dicing process.

FIG. 9 This is a diagram showing the magnetic properties (M-H properties) of the sample of Example 1 of the present invention before and after the dicing process.

FIG. 10 This is a photograph showing the Nd—Fe—B film (sample) of Comparative Example 1 of the present invention.

DETAILED DESCRIPTION

FIG. 1 shows the Nd—Fe—B film separation mechanism. When a Nd—Fe—B film is directly formed on a Si substrate, film separation and other problems will arise due to the strain caused by the difference in thermal expansion rate between the film and the substrate during the subsequent heat treatment. In many of the samples, it has been confirmed that film separation or substrate fracture occurs during the cooling process after the heat treatment, and one cause is considered to be the stress during the contraction. The difference in the thermal expansion rate during the rise in temperature is also considered to be one cause that generates stress, but the sample immediately after the deposition has an amorphous structure and crystallization based on heat treatment causes the sample to shrink, and therefore, the influence of the force that works when the once-crystallized sample shrinks; that is, the influence of stress that works during the fall in temperature, is considered to be greater in comparison to the stress that works during the rise in temperature.

In light of the foregoing circumstances, as shown in FIG. 2, the present inventors focused on the fact that Nd has a thermal expansion coefficient intermediate between Nd$_2$Fe$_{14}$B and Ta, and discovered that, by directly depositing a Nd—Fe—B film having a Nd content that is greater than a stoichiometric composition on a silicon substrate, it is possible to alleviate the difference in thermal expansion rate between the Si substrate and the Nd—Fe—B film, and thereby prevent Nd—Fe—B film separation and Si substrate fracture.

FIG. 3 shows the relation of the Nd content and the film thickness that affect the separability of the Nd—Fe—B film on a Si substrate when controlling the Nd content of the target and increasing the Nd content of the sample. Here, the Nd content is defined based on the atomic ratio Nd/(Nd+Fe). When the film thickness of the rare earth thin film is 70 μm or less, the Nd content satisfies the conditional expression of $0.15 \leq Nd/(Nd+Fe) \leq 0.25$ in terms of an atomic ratio. When the film thickness of the rare earth thin film is 70 μm to 115 μm (but excluding 70 μm), the Nd content satisfies the conditional expression of $0.18 \leq Nd/(Nd+Fe) \leq 0.25$ in terms of an atomic ratio. When the film thickness of the rare earth thin film is 115 μm to 160 μm (but excluding 115 μm), the Nd content satisfies the conditional expression of $0.20 \leq Nd/(Nd+Fe) \leq 0.25$ in terms of an atomic ratio.

As shown in FIG. 3, when the film thickness is 70 μm or less but the Nd content is Nd/(Nd+Fe)<0.15 in terms of an atomic ratio, Nd—Fe—B film separation and Si substrate fracture occur. Moreover, when the film thickness is thick at 70 μm to 115 μm (but excluding 70 μm) but the Nd content is Nd/(Nd+Fe)<0.18, Nd—Fe—B film separation and Si substrate fracture occur. Furthermore, when the film thickness is even thicker at 115 μm to 160 μm (but excluding 115 μm) but the Nd content is Nd/(Nd+Fe)<0.20, Nd—Fe—B film separation and Si substrate fracture occur. Meanwhile, if the Nd content is Nd/(Nd+Fe)>0.25 in terms of an atomic ratio, as described later, the residual magnetic flux density tends to decrease and, therefore, the Nd content is set to Nd/(Nd+Fe)≤0.25 in terms of an atomic ratio.

Furthermore, the rare earth thin-film magnet of the present invention has a coercive force (iHc) of preferably 1000 kA/m or more, and more preferably 1300 kA/m or more. Note that the magnetic properties such as the coercive force and the residual magnetization and maximum energy product described later can be measured using a VSM (Vibrating Sample Magnetometer). The relation of the Nd content and the coercive force regarding the Nd—Fe—B rare earth thin-film magnet formed on a Si substrate is shown in FIG. 4.

As shown in FIG. 4, pursuant to the increase in the Nd content in the rare earth thin-film magnet, the coercive force tends to increase, and favorable magnetic properties can be obtained. The reason for this is considered to be because magnetic separation of the $Nd_2Fe_{14}B$ crystal grains occurs due to the increase in the volume of the non-magnetic Nd-rich phase in correspondence with the increase in the Nd content, which consequently increases the coercive force.

Moreover, the rare earth thin-film magnet of the present invention has a residual magnetization (Br) of preferably 0.4 T or more. FIG. 5 shows the relation of the Nd content and the residual magnetization regarding the Nd—Fe—B rare earth thin-film magnet formed on a Si substrate. As shown in FIG. 5, hardly any change in the residual magnetization could be observed even when the Nd content in the rare earth thin-film magnet was increased. However, when the Nd content is Nd/(Nd+Fe)>0.25 in terms of an atomic ratio, the residual magnetization tended to decrease. The reason for this is considered to be because, as the volume of the Nd-rich phase increases in correspondence to the increase in the Nd content, the volume $Nd_2Fe_{14}B$ phase and the saturation magnetization decreased, and consequently the residual magnetization also decreased.

Furthermore, FIG. 6 shows the relation of the Nd content and the maximum energy product $(BH)_{max}$ regarding the Nd—Fe—B rare earth thin-film magnet formed on a Si substrate. While the $(BH)_{max}$ tends to decrease pursuant to the increase in the Nd content in the rare earth thin-film magnet, the rare earth thin-film magnet of the present invention can attain a maximum energy product $(BH)_{max}$ of 40 kJ/m³ or more.

The rare earth thin-film magnet of the present invention can be produced, for example, as follows.

Foremost, a target having a composition of $Nd_{2.6}Fe_{14}B$ is mounted on a pulsed laser deposition device. Next, the inside of the chamber is evacuated until the vacuum degree becomes 2 to $8 \times 10^{-5}$ Pa, and the target is thereafter irradiated with a laser through a condenser lens. As the laser, a Nd:YAG laser (emission wavelength: 355 nm, repetition frequency: 30 Hz) may be used.

The power density of the laser is preferably set to be 0.1 to 100 J/cm². When the laser power density is less than 0.1 J/cm², a large amount of droplets may arise when the target is irradiated with the laser, and it causes the density to deteriorate and then causes the magnetic properties to deteriorate. Meanwhile, when the laser power density exceeds 100 J/cm², etching of the target caused by the laser irradiation may occur considerably, and undesirable phenomena, such as the discontinuation of the ablation phenomena, may arise.

On the target surface that was irradiated with a laser as described above, a chemical reaction and a melting reaction will occur, and a plasma referred to as a plume is generated. As a result of the plume reaching the opposing substrate, it is possible to form a thin film of a Nd—Fe—B-based amorphous phase. Subsequently, in order to crystallize the thus deposited Nd—Fe—B-based amorphous film, pulsed heat treatment is performed after the deposition under the following conditions; namely, rated output of 2 to 10 kW and maximum output holding time of 1 to 3 seconds in order to crystallize the Nd—Fe—B-based amorphous mother phase.

Here, if the heat treatment is not sufficiently performed, the crystallization of the Nd—Fe—B-based amorphous phase in the film will be insufficient, and the amorphous phase will remain excessively. Meanwhile, excessive heat treatment will cause the coarsening of the $Nd_2Fe_{14}B$ crystal grains, and the magnetic properties may deteriorate. Accordingly, the pulsed heat treatment is preferably performed under the conditions within the foregoing range. Note that, by extremely short irradiation of infrared rays, the pulsed heat treatment can promote the instantaneous crystallization of the sample to realize the refinement of crystal grains.

Subsequently, by performing, for instance, pulsed magnetization to this crystallized thin film at a magnetic field of 7 T, it is possible to prepare a rare earth thin-film magnet. Note that there is no particular limitation in the magnetization method in the present invention, and a publicly known magnetization method may be used. It is thereby possible to produce the rare earth thin-film magnet of a Nd—Fe—B film, which is free from film separation and substrate fracture and has a large Nd content, on a Si substrate. Furthermore, not only does this rare earth thin-film magnet yield superior magnetic properties, but can be directly deposited on a versatile Si substrate, and therefore, the rare earth thin-film magnet of the present invention is effective in preparing micro actuators of micro magnetic devices for MEMS and others.

EXAMPLES

The present invention is now explained based on the following Examples and Comparative Examples. Note that these Examples merely illustrate certain examples of the present invention, and this invention is not limited in any way by these Examples. In other words, the present invention is limited only by the scope of its claims, and covers the various modifications other than the Examples that are included in this invention.

Example 1

A $Nd_{3.0}Fe_{14}B$ target having a purity of 99.9% (3N) and a relative density of 99% was mounted on a pulsed laser deposition device. Subsequently, the inside of a chamber was evacuated to a vacuum and, after confirming that a vacuum degree of $10^{-5}$ Pa has been attained, the target being rotated at approximately 11 rpm was irradiated with a Nd:YAG laser (emission wavelength: 355 nm) at a repetition frequency of 30 Hz to subject the target material to ablation. Here, the distance between the target and the substrate was set to 10 mm, and the laser power density on the target surface was set to be roughly 4 J/cm². As the substrate, a (100) monocrystal Si of 5 mm square having a thickness of 622 μm was used. A Nd—Fe—B amorphous film having a Nd content of Nd/(Nd+Fe)=0.18 in terms of an atomic ratio was thereby deposited on a Si substrate at a thickness of 113 μm. Note that the film thickness was evaluated using a micrometer, and the chemical composition was analyzed using EDX (Energy Dispersive X-ray spectroscopy).

Subsequently, the Nd—Fe—B-based amorphous phase was crystallized by pulsed heat treatment (heat treatment temperature: approximately 500 to 800° C.) at a rated output of 8 kW and a maximum output holding time of approximately 3 seconds.

Pulsed magnetization was thereafter performed at a magnetic field of 7 T to prepare a rare earth thin-film magnet. In order to examine the separability of the Nd—Fe—B film, cutting work via dicing was considered. Dicing was performed, as shown in FIG. 7, by quartering a sample of 5 mm square into a size of 2.5 mm×2.5 mm. However, air-blowing and alcohol immersion were performed during the cutting work so that there will be no residual moisture after the cutting work. A photograph of the samples after dicing is shown in FIG. 8. In the case of a Nd—Fe—B-based thin-film magnet using a Ta strain buffer layer, mechanical damage occurred during the dicing process. However, by directly depositing the thin film on a Si substrate without a strain buffer layer, processing was enabled even after the dicing process without any mechanical damage.

FIG. 9 shows the measurement results of the magnetic properties of the samples before and after dicing as measured with a VSM (Vibrating Sample Magnetometer). The broken line shows the properties before dicing, and the solid line shows the properties after dicing. Before the dicing process, the properties were as follows; specifically, coercive force (iHc) of 1163 kA/m, residual magnetization (Br) of 0.50 T, and maximum energy product $(BH)_{max}$ of 41.9 kJ/m$^3$. Meanwhile, after the dicing process, the properties were as follows; specifically, coercive force (iHc) of 1144 kA/m, residual magnetization (Br) of 0.55 T, and maximum energy product $(BH)_{max}$ of 53.1 kJ/m$^3$; and no notable deterioration in the magnetic properties due to the processing could be observed.

Example 2

A $Nd_{2.6}Fe_{14}B$ target having a purity of 99.9% (3N) and a relative density of 99% was mounted on a pulsed laser deposition device. Subsequently, the target material was subject to ablation under the same conditions as Example 1. A Nd—Fe—B amorphous film having a Nd content of Nd/(Nd+Fe)=0.15 in terms of an atomic ratio was thereby deposited on a Si substrate at a thickness of 67 μm. Note that the film thickness was evaluated using a micrometer, and the chemical composition was analyzed using EDX (Energy Dispersive X-ray spectroscopy).

Subsequently, the Nd—Fe—B-based amorphous phase was crystallized by pulsed heat treatment (heat treatment temperature: approximately 500 to 800° C.) at a rated output of 8 kW and a maximum output holding time of approximately 3 seconds. Pulsed magnetization was thereafter performed at a magnetic field of 7 T to prepare a rare earth thin-film magnet. Subsequently, dicing was performed in the same manner as Example 1, but no mechanical damage could be acknowledged. As a result of evaluating the magnetic properties of this rare earth thin-film magnet with a VSM (Vibrating Sample Magnetometer), the properties were as follows; specifically, coercive force (iHc) of 1144 kA/m, residual magnetization (Br) of 0.55 T, and maximum energy product $(BH)_{max}$ of 53.0 kJ/m$^3$; and favorable results were obtained.

Example 3

A $Nd_{3.5}Fe_{14}B$ target having a purity of 99.9% (3N) and a relative density of 99% was mounted on a pulsed laser deposition device. Subsequently, the target material was subject to ablation under the same conditions as Example 1. A Nd—Fe—B amorphous film having a Nd content of Nd/(Nd+Fe)=0.23 in terms of an atomic ratio was thereby deposited on a Si substrate at a thickness of 160 μm. Note that the film thickness was evaluated using a micrometer, and the chemical composition was analyzed using EDX (Energy Dispersive X-ray spectroscopy).

Subsequently, the Nd—Fe—B-based amorphous phase was crystallized by pulsed heat treatment (heat treatment temperature: approximately 500 to 800° C.) at a rated output of 8 kW and a maximum output holding time of approximately 3 seconds. Pulsed magnetization was thereafter performed at a magnetic field of 7 T to prepare a rare earth thin-film magnet. Subsequently, dicing was performed in the same manner as Example 1, but no mechanical damage could be acknowledged. As a result of evaluating the magnetic properties of this rare earth thin-film magnet with a VSM (Vibrating Sample Magnetometer), the properties were as follows; specifically, coercive force (iHc) of 1200 kA/m, residual magnetization (Br) of 0.51 T, and maximum energy product $(BH)_{max}$ of 44.0 kJ/m$^3$; and favorable results were obtained.

Comparative Example 1

A $Nd_{2.0}Fe_{14}B$ target having a purity of 99.9% (3N) and a relative density of 99% was mounted on a pulsed laser deposition device. Subsequently, the target material was subject to ablation under the same conditions as Example 1. A Nd—Fe—B amorphous film having a Nd content of Nd/(Nd+Fe)=0.119 in terms of an atomic ratio was thereby deposited on a Si substrate at a thickness of 67 μm. Note that the film thickness was evaluated using a micrometer, and the chemical composition was analyzed using EDX (Energy Dispersive X-ray spectroscopy).

Subsequently, the Nd—Fe—B-based amorphous phase was crystallized by pulsed heat treatment (heat treatment temperature: approximately 500 to 800° C.) at a rated output of 8 kW and a maximum output holding time of approximately 3 seconds. The photograph of the Nd—Fe—B film (sample) after the heat treatment is shown in FIG. 10. In cases where the film thickness is 67 μm, when the Nd—Fe—B film is of a stoichiometric composition, film separation and substrate fracture occurred as shown in FIG. 10.

Comparative Example 2

A $Nd_{2.8}Fe_{14}B$ target having a purity of 99.9% (3N) and a relative density of 99% was mounted on a pulsed laser deposition device. Subsequently, the target material was subject to ablation under the same conditions as Example 1. A Nd—Fe—B amorphous film having a Nd content of Nd/(Nd+Fe)=0.17 in terms of an atomic ratio was thereby deposited on a Si substrate at a thickness of 110 μm. Note that the film thickness was evaluated using a micrometer, and the chemical composition was analyzed using EDX (Energy Dispersive X-ray spectroscopy).

Subsequently, the Nd—Fe—B-based amorphous phase was crystallized by pulsed heat treatment (heat treatment temperature: approximately 500 to 800° C.) at a rated output of 8 kW and a maximum output holding time of approximately 3 seconds. In cases where the film thickness is relatively thick at 110 μm, even when the Nd content is slightly high, film separation and substrate fracture occurred.

Comparative Example 3

A $Nd_{2.8}Fe_{14}B$ target having a purity of 99.9% (3N) and a relative density of 99% was mounted on a pulsed laser deposition device. Subsequently, the target material was subject to ablation under the same conditions as Example 1. A Nd—Fe—B amorphous film having a Nd content of Nd/(Nd+Fe)=0.19 in terms of an atomic ratio was thereby deposited on a Si substrate at a thickness of 150 μm. Note that the film thickness was evaluated using a micrometer, and the chemical composition was analyzed using EDX (Energy Dispersive X-ray spectroscopy).

Subsequently, the Nd—Fe—B-based amorphous phase was crystallized by pulsed heat treatment (heat treatment temperature: approximately 500 to 800° C.) at a rated output of 8 kW and a maximum output holding time of approximately 3 seconds. In cases where the film thickness is thick at 150 μm, even when the Nd content is slightly high, film separation and substrate fracture occurred.

The present invention yields a superior effect of being able to stably deposit a Nd—Fe—B film, which is free from separation, on a Si substrate via pulsed laser deposition up to a maximum film thickness of 160 μm. The Nd—Fe—B rare earth thin-film magnet of the present invention is effective in applications to magnetic devices being applied in energy sectors such as energy harvest, and medical device sectors. The present invention is particularly effect in preparing micro actuators of micro magnetic devices for MEMS.

The invention claimed is:

1. A rare earth thin-film magnet of a Nd—Fe—B film formed by heat-treating an amorphous film deposited directly on a Si substrate, and having a film thickness of 10 μm or more and 160 μm or less, a composition consisting of Nd, Fe and B, and a structure consisting of $Nd_2Fe_{14}B$ crystal grains mixed with crystal grains of a non-magnetic Nd-rich phase, wherein the composition has a Nd content which is larger than the stoichiometric content of $Nd_2Fe_{14}B$ and satisfies a compositional condition depending on the thickness of the Nd—Fe—B alloy film such that, in a case where the thickness is 70 μm or less, 70 μm to 115 μm excluding 70 μm, or 115 μm to 160 μm excluding 115 μm, a ratio of Nd/(Nd+Fe) in terms of atomic % is in a range of 0.15≤Nd/(Nd+Fe)≤0.25, 0.18≤Nd/(Nd+Fe)≤0.25, or 0.20≤Nd/(Nd+Fe)≤0.25, respectively.

2. The rare earth thin-film magnet according to claim 1, wherein the rare earth thin-film magnet has a coercive force of 1000 kA/m or more.

3. The rare earth thin-film magnet according to claim 2, wherein the rare earth thin-film magnet has a residual magnetization of 0.4 T or more.

4. The rare earth thin-film magnet according to claim 3, wherein the rare earth thin-film magnet has a maximum energy product of 40 $kJ/m^3$ or more.

5. A method of producing the rare earth thin-film magnet according to claim 1, comprising: a step of depositing the rare earth thin film via pulsed laser deposition; a step of crystallizing the deposited rare earth thin film by performing heat treatment thereto; and a step of magnetizing the crystallized rare earth thin film to prepare the rare earth thin-film magnet.

6. The method of producing the rare earth thin-film magnet according to claim 5, wherein, in the step of depositing the rare earth thin film, pulsed laser power density is set to 0.1 to 100 $J/cm^2$.

7. The method of producing the rare earth thin-film magnet according to claim 6, wherein, in the step of crystallizing the rare earth thin film, pulsed heat treatment is performed under the following conditions; namely, rated output of 2 to 10 kW and maximum output holding time of 1 to 3 seconds.

8. The method of producing the rare earth thin-film magnet according to claim 5, wherein, in the step of crystallizing the rare earth thin film, pulsed heat treatment is performed under the following conditions; namely, rated output of 2 to 10 kW and maximum output holding time of 1 to 3 seconds.

9. The rare earth thin-film magnet according to claim 1, wherein the rare earth thin-film magnet has a residual magnetization of 0.4 T or more.

10. The rare earth thin-film magnet according to claim 1, wherein the rare earth thin-film magnet has a maximum energy product of 40 $kJ/m^3$ or more.

11. The rare earth thin-film magnet according to claim 1, wherein the film thickness is 67 μm to 160 μm.

* * * * *